United States Patent
Beck et al.

(10) Patent No.: US 10,126,394 B2
(45) Date of Patent: Nov. 13, 2018

(54) MAGNETIC RESONANCE APPARATUS AND METHOD FOR SIMULTANEOUS MULTI-SLICE IMAGING WITH ARBITRARY SLICE NUMBERS

(71) Applicant: Siemens Healthcare GmbH, Erlangen (DE)

(72) Inventors: Thomas Beck, Erlangen (DE); Himanshu Bhat, Newton, MA (US); Uvo Hoelscher, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 491 days.

(21) Appl. No.: 14/994,685

(22) Filed: Jan. 13, 2016

(65) Prior Publication Data

US 2017/0199259 A1    Jul. 13, 2017

(51) Int. Cl.
*G01V 3/00* (2006.01)
*G01R 33/483* (2006.01)
*G01R 33/561* (2006.01)

(52) U.S. Cl.
CPC ...... *G01R 33/4835* (2013.01); *G01R 33/5611* (2013.01)

(58) Field of Classification Search
USPC ........................................... 324/309
See application file for complete search history.

(56) References Cited

U.S. PATENT DOCUMENTS

| | | | |
|---|---|---|---|
| 2013/0342200 A1* | 12/2013 | Ugurbil | G01R 33/543 324/307 |
| 2015/0260820 A1* | 9/2015 | Speier | G01R 33/4835 324/309 |
| 2015/0309142 A1* | 10/2015 | Li | G01R 33/5611 324/309 |

* cited by examiner

*Primary Examiner* — Rodney Fuller
(74) *Attorney, Agent, or Firm* — Schiff Hardin LLP

(57) ABSTRACT

In a method and apparatus for acquiring magnetic resonance (MR) data from a subject, wherein the MR data are acquired in respective data sets individually from multiple slices in a stack within the examination subject, and wherein the number of slices in the stack is not an integer multiple of a number of slices that are desired to be scanned simultaneously, a quotient of the number of slices in the stack and the number of slices to be acquired simultaneously is formed. A protocol for operating the scanner of the apparatus is then determined wherein the number of simultaneously scanned slices is set either by rounding by quotient up to the next highest integer, or rounding the quotient down to the next lowest integer.

10 Claims, 3 Drawing Sheets non SMS case          SMS case rep 1      rep 2      add 1

MAGNETIC RESONANCE APPARATUS AND METHOD FOR SIMULTANEOUS MULTI-SLICE IMAGING WITH ARBITRARY SLICE NUMBERS

BACKGROUND OF THE INVENTION

Field of the Invention

The present invention concerns magnetic resonance imaging, and in particular concerns magnetic resonance imaging techniques for multi-slice imaging.

Description of the Prior Art

Many magnetic resonance imaging (MRI) examinations that are currently conducted incorporate two-dimensional (2D) measurements. In such conventional measurements, magnetic resonance data are acquired from a stack of parallel, adjacent 2D slices, with the stack covering the entirety of the region of interest in the body of the patient. Usually, nuclear spins in each slice are excited separately, i.e., the excitation takes place slice-by-slice, and the resulting magnetic resonance signals are subsequently also acquired separately (slice-by-slice). This means that the data acquisition for one slice is independent of the data acquisition from the other slices in the stack. Therefore, the number of slices in the stack can be selected without limitation, because each slice forms its own individual part of the overall measurement.

A more recent technique is known as simultaneous multi-slice (SMS) imaging, which can accelerate scans by exciting nuclear spins in, and acquiring resulting magnetic resonance signals from, multiple slices at the same time. In order to do so, SMS imaging employs radio-frequency (RF) excitation pulses that differ in design from RF excitation pulses that are used in non-SMS imaging. The RF excitation pulses that are used in SMS imaging are called multiband pulses, and are designed so as to excite two or more (usually equidistant) slices simultaneously. The number of slices that are excited at the same time (bands) is called the SMS-factor.

One consequence of SMS imaging is that the number of slices that are acquired for a given volume of the patient can only be an integer multiple of the SMS-factor. The number of multiband RF excitation pulses that are used for the acquisition of the entire stack of slices must be an integer number. Consequently, the number of scanned slices is the product of the number of such RF pulses and the SMS-factor. This limitation leads to the situation that, for example, an SMS-factor of two allows only even numbers of slices to be scanned, and an SMS-factor of five, for example, only allows 5, 10, 15, 20 . . . slices to be scanned.

Many imaging situations, however, require that the number of slices be selected without restriction. Such is the case, for example, in neuro-imaging, wherein the slice numbers are often odd, and hence are not compatible with even SMS-factors. Moreover, computer program tools are commercially available that automatically determine and adapt the number of slices from which MR data are to be acquired to the dimensions of the head of a patient. Since this number is patient-specific, feasible acceleration factors which are a divisor of the number of slices are also be patient specific. It may possibly be odd or even and, if the adapted number of slices turns out to be odd, conventional SMS imaging with an even acceleration factor is then not available for conducting the examination.

Heretofore, it has been accepted as a technical limitation of SMS imaging that the selection of the number of slices will be subject to the aforementioned limitations. In addition to then making SMS imaging unavailable for certain examinations, this also leads to the inconvenience that images acquired by SMS imaging cannot always match the slice numbers and positions of images acquired by non-SMS imaging. If 25 slices have been scanned, for example, with a TSE (turbo spin echo) sequence without SMS imaging, and 26 slices have been scanned, for example, with a diffusion EPI (echo planar imaging) sequence with SMS imaging covering the same volume, the respective images acquired with the different sequences cannot be viewed side-by-side.

SUMMARY OF THE INVENTION

It is an object of the present invention to provide a magnetic resonance imaging apparatus and method that avoid the aforementioned limitations associated with conventional SMS imaging, and allow SMS imaging still to be used with an arbitrary number of slices in a volume to be scanned.

As noted above, if the desired number of slices that are needed to completely image a particular volume (region of interested, ROI) of a patient is an integer multiple of the SMS-factor, the aforementioned problem does not arise, and therefore the method and apparatus according to the invention are applicable when that non-problematic situation does not exist. In accordance with the invention, the desired number of slices (NoS) and the SMS-factor (SMS-F) are provided as electronic designations (inputs) to a control computer of a magnetic resonance imaging apparatus, which operates the scanner of the magnetic resonance imaging apparatus. From these electronic designations, the computer in accordance with the invention executes an algorithm to form the quotient $$EX = NoS/SMS\text{-}F$$

Because the aforementioned non-problematic situation does not exist, EX has a non-integer value. In accordance with the invention, the computer determines a protocol for operating the scanner wherein the number of slices in a stack that will be simultaneously scanned is EX either rounded up to the next highest integer value, or rounded down to the next lowest integer value.

When EX is rounded down, this will mean that fewer slices are acquired than required to fill up the whole stack. The pulse sequence that is then generated according to the determined protocol will have an appropriate number of multiband RF pulses in order to simultaneously scan multiple slices by SMS imaging, and the pulse sequence will also include one or more additional RF excitation pulses in order to excite nuclear spins in the remaining slice or slices that are not among the SMS simultaneously scanned slices. If more than one such additional slice needs to be excited, an additional multiband RF pulse can be included in the pulse sequence in order to simultaneously scan those additional multiple slices, or multiple, additional single band RF pulse can be used. If only one additional slice needs to be excited, one conventional single band RF pulse can be added in the sequence.

If EX is rounded up to the next highest integer, this means that more slices will be simultaneously scanned than are actually needed to cover the ROI. The data from any such additional slice or slices are then discarded.

The method can also be used to advantage when the magnetic resonance data of the ROI are acquired by executing multiple repetitions of scanning of the stack of slices. In such a situation, the number of multiband RF excitation pulses is then EX rounded to the next smaller integer value, which means that the number of excited slices in the first repetition is smaller than the number of desired slices. These "missing" slices are then placed at different locations in the subsequent repetitions so that data therefrom are acquired by a dedicated multiband excitation. After the last repetition an additional scan can use multiband RF pulses with either the same or different spatial spacing so that all slices are scanned the same number of times. The additional scan can also use single band RF pulses to acquire the missing repetitions for certain slices.

In the algorithm, executed within the control computer in order to determine the number of slices that will be simultaneously scanned in the protocol, whether EX is rounded up or rounded down can be dependent on aspects of the particular examination to be undertaken, such as the magnetization steady state, the measurement time, the RF power applied to the patient, particular slice profiles, etc. In automatic protocol development programs, these items can be individually weighted and combined in order to arrive at an automatically calculated quantification, which then can be used as a criterion for the computer selecting, in the aforementioned algorithm, whether to round up or round down EX. Alternatively, the technician responsible for conducting the examination can make a further entry into the control computer that designates, based on the technician's own preference or experience, whether rounding down or rounding up should be implemented. It is also possible to present the technician with a displayed presentation of one protocol determined by rounding up EX, and another protocol determined by rounding down EX. These different protocols will have different numbers of simultaneously acquired slices, and the technician can then make a selection between the two presented protocols.

The present invention also encompasses a magnetic resonance imaging system that is constructed and operated in accordance with the present invention. Such a magnetic resonance imaging system includes a magnetic resonance data acquisition scanner that is operated by a control computer. The control computer is configured to devise a magnetic resonance data acquisition protocol, and a corresponding pulse sequence, as described above, and then operate the scanner according to that protocol. The magnetic resonance imaging apparatus can also include an image reconstruction computer that reconstructs an image of the subject from the magnetic resonance raw data that have been acquired in the manner described above, according to the determined protocol.

The present invention also encompasses a non-transitory, computer-readable data storage medium that is encoded with programming instructions. When the storage medium is loaded into a control computer of a magnetic resonance imaging apparatus, the programming instructions cause the control computer to devise a data acquisition protocol, and a corresponding pulse sequence, and to operate the data acquisition scanner of the magnetic resonance imaging apparatus to acquire magnetic resonance raw data in the manner described above. The programming instructions can also configure an image reconstruction computer to reconstruct an image of a patient from the magnetic resonance raw data acquired in the above-described manner. The programming instructions can be distributed among several separate and independent computers or processors of the magnetic resonance imaging apparatus, or at least some of these computers or processors can be integrated together, in which case the programming instructions are similarly consolidated in fewer components.

DESCRIPTION OF THE PREFERRED EMBODIMENTS

Figure 5:
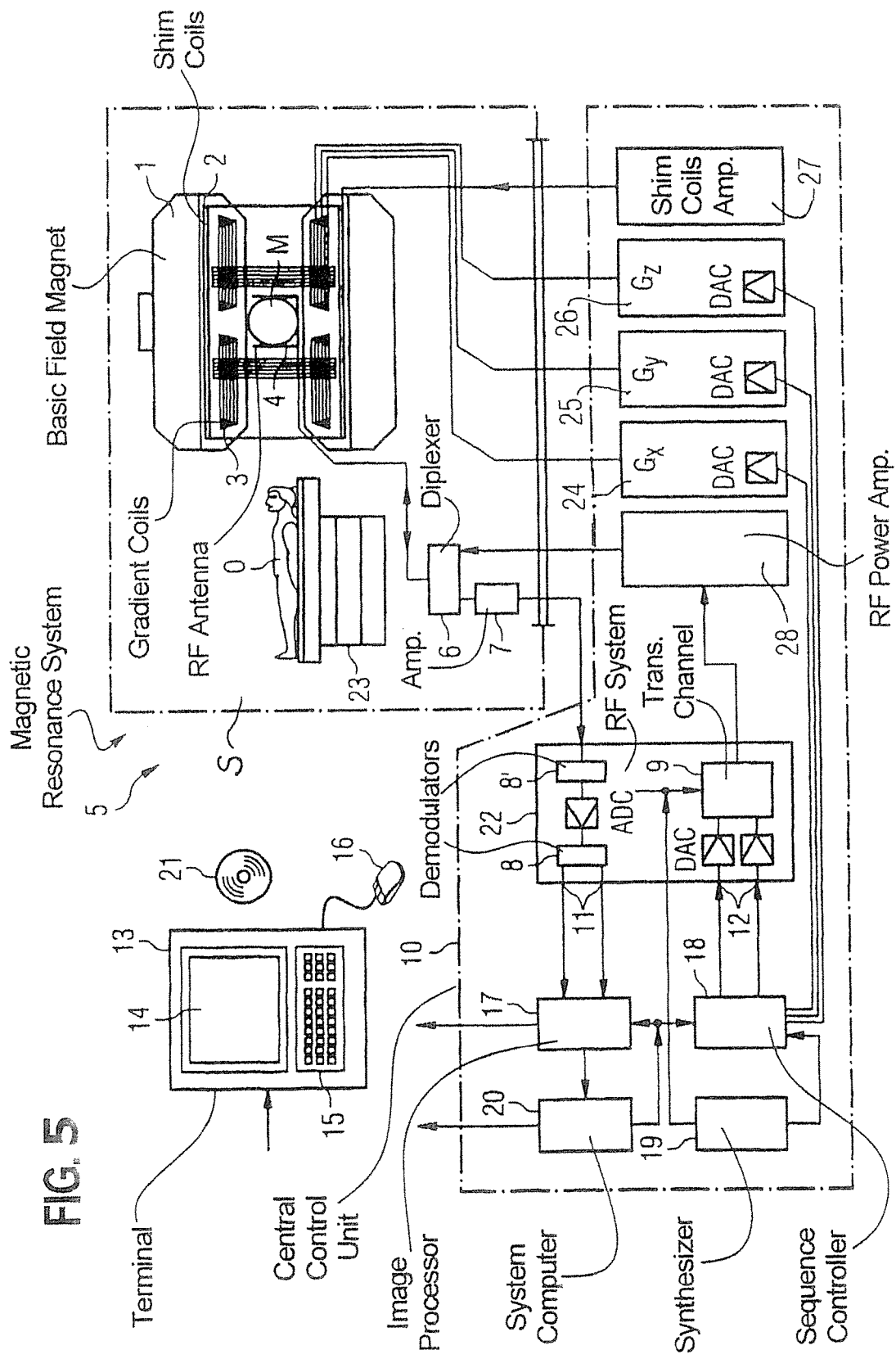
FIG. 5 schematically illustrates a magnetic resonance apparatus constructed and operating in accordance with the invention.

FIG. 5 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 27 for the shim-coils 2.

A cylindrically shaped gradient coil system 3 is incorporated in the basic field magnet 1, composed of three windings. Each winding is supplied by a corresponding amplifier 24-26 with power for generating a linear gradient field in a respective axis of a Cartesian coordinate system. The first partial winding of the gradient field system 3 generates a gradient $G_x$ in the x-axis, the second partial winding generates a gradient $G_y$ in the y-axis, and the third partial winding generates a gradient $G_z$ in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the processing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

In accordance with the present invention, the central control unit 17 operates as a control computer of the magnetic resonance imaging apparatus and is provided with an electronic designation of a desired number of slices (NoS) in a stack for a magnetic resonance examination of a particular patient, more specifically a particular region of interest (ROI) of that patient, and is also provided with an SMS-factor (SMS-F) for acquiring at least some of those slices by SMS imaging. NoS is not an integer multiple of SMS-F. Therefore, in accordance with the invention, the control computer calculates the quotient $$EX = NoS/SMS\text{-}F.$$

wherein EX has a non-integer value. In accordance with the invention, the number of multiband excitation pulses that are used for SMS imaging in the particular examination is EX rounded to either the next smaller integer value or the next highest integer value. The control computer then devises a magnetic resonance data acquisition protocol for operating the data acquisition scanner of the magnetic resonance imaging apparatus, and a corresponding pulse sequence that includes an appropriate number of multiband RF excitation pulses, dependent on the rounded-up or rounded-down value.

If EX is rounded down, this means that the number of excited slices is smaller than the number of desired slices. These "missing" slices can be measured either with single band RF excitation pulses, which excite only one slice at a time, or with an adapted multiband RF excitation pulse, which simultaneously excites a smaller number of slices than the number of slices designated by SMS-F.

Figure 1:
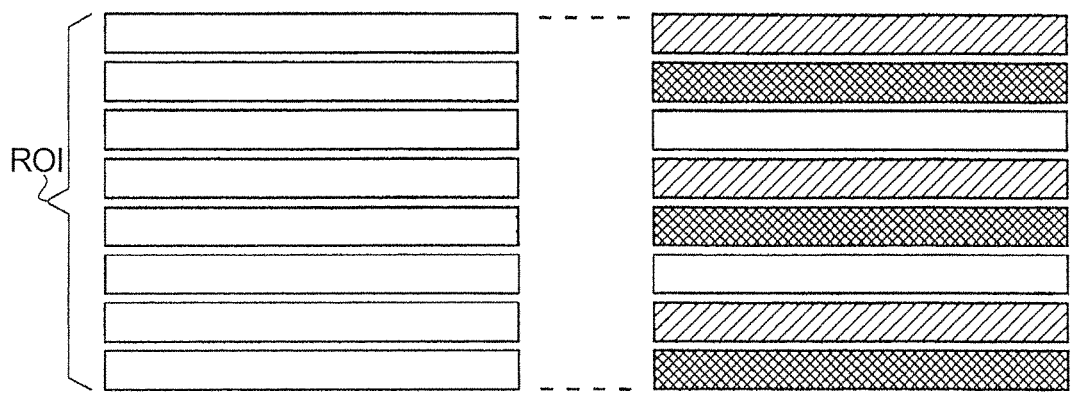
FIG. 1 schematically illustrates an example of the method with a SMS-F of three according to the invention that results in fewer slices being simultaneously scanned than the total number of desired slices, wherein the remaining slices are excited by two single band RF pulses. Multiband RF pulses are hatched and single band RF pulses are plain.

One example of this type of protocol is schematically illustrated in FIG. 1. In the example shown in FIG. 1, it is desired to scan (acquire MR data from) eight slices, and an SMS-factor of three is selected. The left side of FIG. 1 schematically illustrates the non-SMS case, wherein each of the eight slices would be individually excited with eight single band pulses, respectively illustrated with no hatching.

The SMS case in accordance with the invention is schematically shown at the right side of FIG. 1. The protocol devised in accordance with the invention in this embodiment has two sets of simultaneously excited slices, and thus the corresponding pulse sequence has two multiband excitation pulses, each with three bands. The three bands of the first multiband are RF excitation pulse are indicated with the hatching in the (from top to bottom) first, fourth and seventh rectangles at the left of FIG. 1, and the three bands of the second multiband RF excitation pulse are indicated with different hatching in the second, fifth and eighth rectangles. The protocol and pulse sequence then require the use of two single band pulses, again shown without hatching at the left side of FIG. 1. This results in a total of eight scanned slices and four RF excitations.

Figure 2:
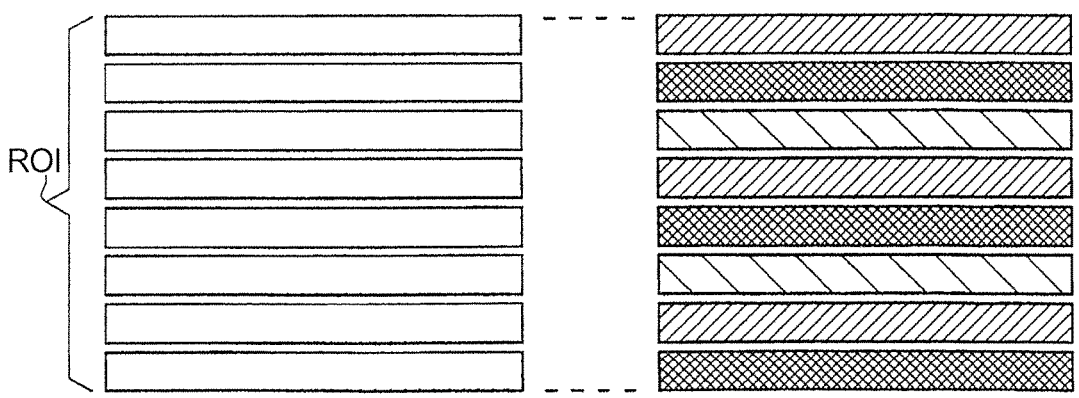
FIG. 2 schematically illustrates an example of the method with a SMS-F of three according to the invention that results in fewer slices being simultaneously scanned than the total number of desired slices, wherein the remaining slices are excited by one multiband RF pulse with a SMS-F of two.

In the example shown in FIG. 2, again the stack includes eight slices, and an SMS-factor of three is selected. In this example as well, two multiband excitation pulses are used, each having three bands (three simultaneously excited slices) indicated in the same manner as in FIG. 1. This again results in six slices being scanned by SMS imaging. In the example of FIG. 2, one additional multiband RF excitation pulse is used, that has two bands, as indicated by the same hatching in the third and sixth slices from the top of the stack at the left of FIG. 2. In a further example (not shown in the figures), the stack is composed of fifteen slices, and an SMS-factor of two is selected. In this example, seven multiband RF excitation pulses are used, which result in SMS imaging of fourteen of the slices, and one single band RF excitation pulse is used, resulting in all fifteen of the slices in the stack being scanned.

Figure 3:
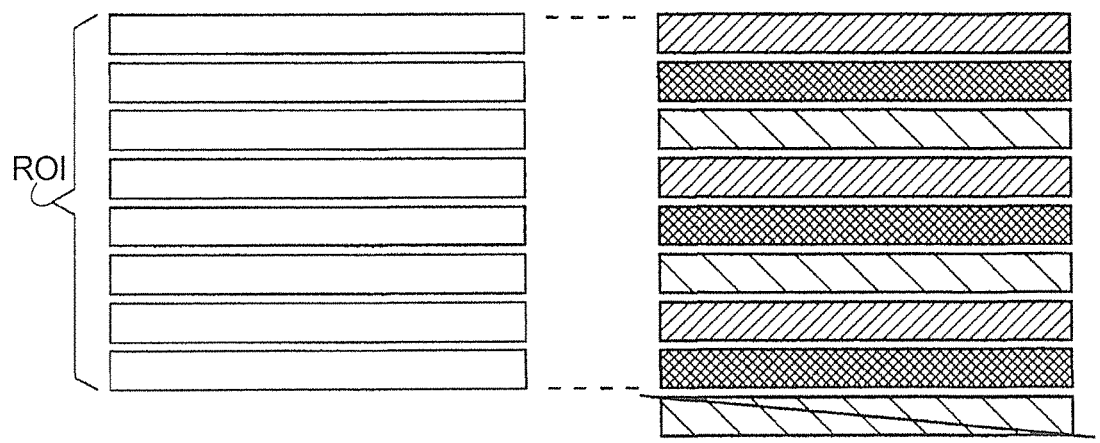
FIG. 3 schematically illustrates an example of the method according to the invention wherein more slices are simultaneously scanned than are needed, and wherein MR data from the "extra" slice are discarded.

The example shown in FIG. 3 is for the situation wherein EX is rounded up to the next integer. This means that more slices will be excited than are necessary in order to form the stack that encompasses the ROI.

In the example shown in FIG. 3, the stack again is composed of eight slices, and SMS-factor of three is selected. In this example, three multiband excitation pulses are used, where each multiband RF pulse excites three slices as designated by the three different types of hatching shown at the left side of FIG. 3. This results in excitation taking place in nine slices, and therefore the MR raw data from one of those slices is discarded. In FIG. 3, this discarded slice is arbitrarily selected as the bottommost slice at the right side of FIG. 3. The discarding of the MR data thereof is schematically indicated by the slanted line through that bottommost slice. Another example in the case of EX being rounded up (not shown in the figures) is when it is desired to acquire raw MR data from fifteen slices in a stack, and an SMS-factor of two is selected. In this example, eight multiband RF excitation pulses are used, thereby resulting in the excitation of sixteen slices. Again, the MR data from one of those slices is then discarded in the image reconstruction algorithm.

The position of the discarded slice or slices can be simply made by identifying one or more slices that is/are outside of the region of interest, so that all non-discarded slices are in the region of interest. Another option is to select the position of the discarded slice or slices by execution of an optimization algorithm that "saves" (i.e. does not discard) slices that are best optimized for a particular type of image correction that is to be implemented, such as the influence of gradient field Maxwell terms.

The present invention can also be employed when multiple repetitions of the acquisition of MR data from one stack are to be implemented. In this case, the number of multiband RF excitation pulses that is used is determined by rounding EX to the next smaller integer. This means that the number of excited slices in a first repetition will be smaller than the number of desired slices. These "missing" slices are placed at different locations within the stack in each subsequent repetition, so that they can be scanned by a dedicated multiband RF excitation.

Figure 4:
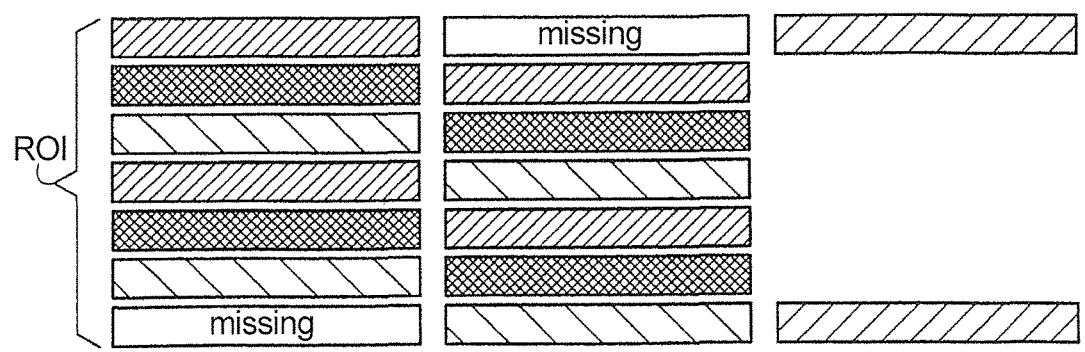
FIG. 4 schematically illustrates an example of the method according to the invention wherein data are acquired from the region of interest in multiple repetitions.

An example of this embodiment of the method is shown in FIG. 4. In this example, it is desired to acquire MR data from the stack in two repetitions of seven slices each, and an SMS-factor of two is selected. In the first repetition rep1, three multiband excitation pulses are used, resulting in six scanned slices in each repetition. The missing slices in each repetition are placed at opposite ends of the stack, and are respectively acquired in different repetitions. In the example shown in FIG. 4, MR data are not acquired from the bottommost stack in the first repetition rep1, and MR raw data are not acquired from the topmost stack in the second repetition rep2. The data from these two slices are then acquired in an additional scan, designated add 1. This results in 2×7 scanned slices and seven excitations.

The determination as to whether EX should be rounded up or rounded down can be made automatically using factors that are quantifiable in known magnetic resonance protocol determining programs, such as the magnetization steady state of the nuclear spins, the measurement time, the RF power applied to the patient, slice profiles, etc. It is also possible for a user to manually enter an electronic designation into the control computer, so as to specify that EX is to be rounded up or rounded down, dependent on the experience and preferences of the technician who is conducting the examination. It is also possible for the protocol determination algorithm to produce two protocols, one with EX being rounded down and another with EX being rounded up, and to present both of those protocols to the technician at a display, so that the technician can then select one of those protocols.

In the embodiments wherein one or more slices is/are discarded, the data in the discarded slice or slices may be used for additional purposes, such as for corrections relating to the radiated RF field B1, corrections to the basic magnetic field B0, and/or corrections with respect to other supporting data.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data, comprising:

providing first and second electronic designations to a control computer and, in said control computer, generating therefrom an MR data acquisition protocol to operate an MR scanner according to the MR data acquisition protocol to acquire raw MR data from a subject in said scanner, said first electronic designation designating a first integer number of adjacent slices in a stack in the subject from which said raw MR data are to be acquired respectively in a plurality of individual MR datasets, and said second electronic designation designating a second integer number of said slices from which the respective individual MR data sets are to be acquired simultaneously by radiation of multiband RF excitation pulses by said scanner, said first integer number not being a multiple of said second integer number;

in said control computer, automatically executing an algorithm to set a number of said slices in said protocol from which the respective individual MR data sets are to be acquired simultaneously;

in said algorithm in said control computer, forming a quotient of said first integer divided by said second integer;

in said algorithm in said control computer, selectively rounding up said quotient to a next highest integer or rounding down said quotient to a next lowest integer;

in said algorithm in said control computer, when said quotient is rounded down, setting said number of slices in said protocol from which the respective individual data sets are to be acquired simultaneously as a multiple of said next lowest integer;

in said algorithm in said control computer, when said quotient is rounded up, setting said number of slices in said protocol from which the respective individual data sets are to be acquired simultaneously as a multiple of said next highest integer; and in said control computer generating a pulse sequence corresponding to said protocol and emitting said pulse sequence from said control computer in an electronic form designed to operate said scanner according to said pulse sequence to acquire said raw MR data from said subject in the scanner.

2. A method as claimed in claim 1 comprising executing said algorithm in said control computer as part of an automated protocol development program, and automatically selecting, in said algorithm, whether to round said quotient up or round said quotient down dependent on quantified information in said protocol development program describing the acquisition of said raw MR data from said subject.

3. A method as claimed in claim 1 comprising providing said control computer with a third electronic designation that designates to said control computer whether to round up said quotient or round down said quotient in said algorithm.

4. A method as claimed in claim 1 comprising generating a first protocol with said algorithm in said control computer wherein said quotient is rounded up, and generating a second protocol with said algorithm in said control computer wherein said quotient is rounded down, and displaying both of said first and second protocols at a display in communication with said control computer, and allowing manual selection, via said control computer, of said first protocol or said second protocol for operating said scanner to acquire said raw MR data from said subject.

5. A method as claimed in claim 1 comprising, when said quotient is rounded down, so said number of slices in said protocol from which the respective individual data sets are to be acquired simultaneously is less than a total number of slices in said stack, thereby resulting in a remainder of slices in said stack, generating said protocol and said pulse sequence in said control computer to non-simultaneously, individually acquire MR raw data from each slice in said remainder.

6. A method as claimed in claim 1 comprising, when said quotient is rounded down, so said number of slices in said protocol from which the respective individual data sets are to be acquired simultaneously is fewer than a total number of slices in said stack, thereby resulting in a remainder of slices in said stack, generating said protocol and said pulse sequence in said control computer to simultaneously acquire MR raw data from all slices in said remainder.

7. A method as claimed in claim 1 comprising, when said quotient is rounded up, so that said number of slices in said protocol from which the respective individual data slices are to be acquired simultaneously exceeds a total number of slices in said stack, thereby resulting in magnetic resonance data being acquired from extra slices of the subject, automatically discarding said MR raw data acquired from said extra slices.

8. A method as claimed in claim 1 comprising generating said protocol to acquire said MR data in multiple data acquisition repetitions and, in said algorithm, rounding down said quotient thereby resulting in a number of slices being excited in each repetition that is smaller than a total number of slices in said stack, and generating said protocol and said pulse sequence in said control computer to not acquire raw MR data from slices in respectively different positions in said stack in respective repetitions.

9. A magnetic resonance (MR) imaging apparatus comprising:
an MR scanner adapted to receive a patient therein, said MR scanner comprising a radio-frequency (RF) radiator;
a control computer configured to generate an MR data acquisition protocol to operate said MR scanner according to the MR data acquisition protocol to acquire raw MR data from a subject in said scanner;
said control computer being configured to receive a first electronic designation designating a first integer number of adjacent slices in a stack in the subject from which said raw MR data are to be acquired respectively in a plurality of individual MR datasets, and said second electronic designation designating a second integer number of said slices from which the respective individual MR data sets are to be acquired simultaneously by radiation of multiband RF excitation pulses by said RF radiator, said first integer number not being a multiple of said second integer number;
in said control computer being configured to automatically execute an algorithm to set a number of said slices in said protocol from which the respective individual MR data sets are to be acquired simultaneously;
said control computer being configured to execute said algorithm to form a quotient of said first integer divided by said second integer;
said control computer being configured to execute said algorithm to selectively round up said quotient to a next highest integer or round down said quotient to a next lowest integer;
said control computer being configured to execute said algorithm, when said quotient is rounded down, to set said number of slices in said protocol from which the respective individual data sets are to be acquired simultaneously as a multiple of said next lowest integer;
said control computer being configured to execute said algorithm, when said quotient is rounded up, to set said number of slices in said protocol from which the respective individual data sets are to be acquired simultaneously as a multiple of said next highest integer; and
said control computer being configured to generate a pulse sequence corresponding to said protocol and to emit said pulse sequence in an electronic form designed to operate said scanner according to said pulse sequence to acquire said raw MR data from said subject in the scanner.

10. A non-transitory, computer-readable data storage medium encoded with programming instructions, said storage medium being loaded into a control computer of a magnetic resonance (MR) apparatus that comprises an MR scanner, said programming instructions causing said control computer to:
generate an MR data acquisition protocol to operate the MR scanner according to the MR data acquisition protocol to acquire raw MR data from a subject in said scanner;
receive a first electronic designation designating a first integer number of adjacent slices in a stack in the subject from which said raw MR data are to be acquired respectively in a plurality of individual MR datasets, and receive a second electronic designation designating a second integer number of said slices from which the respective individual MR data sets are to be acquired simultaneously by radiation of multiband RF excitation pulses by said scanner, said first integer number not being a multiple of said second integer number;
automatically execute an algorithm to set a number of said slices in said protocol from which the respective individual MR data sets are to be acquired simultaneously;
in said algorithm, form a quotient of said first integer divided by said second integer;
in said algorithm, selectively round up said quotient to a next highest integer or rounding down said quotient to a next lowest integer;
in said algorithm, when said quotient is rounded down, set said number of slices in said protocol from which the respective individual data sets are to be acquired simultaneously as a multiple of said next lowest integer;
in said algorithm, when said quotient is rounded up, set said number of slices in said protocol from which the respective individual data sets are to be acquired simultaneously as a multiple of said next highest integer; and generate a pulse sequence corresponding to said protocol and emit said pulse sequence from said control computer in an electronic form designed to operate said scanner according to said pulse sequence to acquire said raw MR data from said subject in the scanner.

* * * * *